United States Patent
Arimoto et al.

(10) Patent No.: US 9,780,241 B2
(45) Date of Patent: Oct. 3, 2017

(54) SOLAR CELL

(71) Applicant: SANYO ELECTRIC CO., LTD., Moriguchi-shi, Osaka (JP)

(72) Inventors: Mamoru Arimoto, Gifu (JP); Tsuyoshi Takahama, Osaka (JP); Naofumi Hayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/493,393

(22) Filed: Sep. 23, 2014

(65) Prior Publication Data

US 2015/0083214 A1 Mar. 26, 2015

(30) Foreign Application Priority Data

Sep. 24, 2013 (JP) ................. 2013-196963

(51) Int. Cl.
*H01L 31/0352* (2006.01)
*H01L 31/0224* (2006.01)
*H01L 31/0747* (2012.01)
*H01L 31/20* (2006.01)

(52) U.S. Cl.
CPC ........... *H01L 31/03529* (2013.01); *H01L 31/022441* (2013.01); *H01L 31/0747* (2013.01); *H01L 31/202* (2013.01); *Y02E 10/547* (2013.01); *Y02P 70/521* (2015.11)

(58) Field of Classification Search
CPC ............. H01L 31/022441; H01L 31/05; H01L 31/0504; H01L 31/0508; H01L 31/0516; H01L 31/1892; H01L 31/0463; H01L 31/022425; H01L 31/0236; H01L 31/0682; H01L 31/60; H01L 31/046; H01L 31/0352; H01L 31/28; H01L 31/3213;
(Continued)

(56) References Cited

U.S. PATENT DOCUMENTS

2008/0061293 A1 3/2008 Ribeyron et al.
2013/0139876 A1 6/2013 Shigematsu et al.
2013/0180585 A1 7/2013 Goto et al.

FOREIGN PATENT DOCUMENTS

EP 2600414 A1 6/2013
JP 2009-200267 A 9/2009
JP 2012-033666 A 2/2012
(Continued)

*Primary Examiner* — Devine Pillay
*Assistant Examiner* — Daniel Malley, Jr.
(74) *Attorney, Agent, or Firm* — Metrolexis Law Group, PLLC

(57) ABSTRACT

A solar cell includes a semiconductor substrate of first conductivity type, including first and second principal surfaces; a region of the first conductivity type, including a semiconductor layer structure of the first conductivity type provided on the first principal surface; and a region of an second conductivity type, including a semiconductor layer structure of the second conductivity type provided on the first principal surface. The semiconductor layer structure of the first conductivity type is formed extending into the region of the second conductivity type. Thereby the solar cell is provided with a stack region where the semiconductor layer structure of the second conductivity type is formed on the semiconductor layer structure of the first conductivity type.

13 Claims, 10 Drawing Sheets

(58) Field of Classification Search
CPC ............. H01L 31/76811; H01L 31/682; H01L 23/544; H01L 28/60; H01L 24/80; Y02E 10/50
USPC .......................................................... 136/256
See application file for complete search history.

(56) References Cited

FOREIGN PATENT DOCUMENTS

| | | | | |
|---|---|---|---|---|
| JP | WO 2012018119 A1 * | 2/2012 | ................... | 136/256 |
| JP | 2013-033832 A | 2/2013 | | |

* cited by examiner

US 9,780,241 B2

SOLAR CELL

CROSS REFERENCE TO RELATED APPLICATIONS

This application claims priority from prior Japanese Patent Applications No. 2013-196963, filed on Sep. 24, 2013, entitled "SOLAR CELL", the entire contents of which are incorporated herein by reference.

BACKGROUND OF THE INVENTION

1. Field of the Invention

This disclosure relates to a back contact solar cell.

2. Description of the Related Art

As a solar cell with higher power generation efficiency, a proposal has been made for a so-called back contact solar cell, which includes p-type, and n-type regions formed in its rear surface (for example, Japanese Patent Application Publication No. 2012-33666). No electrodes have to be provided on a light-receiving side of the back contact solar cell. For this reason, its light-receiving efficiency can be improved.

A solar cell module is formed by connecting a plurality of solar cells together. It has been known that a phenomenon of heat generation by some solar cells (a hot spot phenomenon) happens to the solar cell module when: the solar cells are hindered from receiving light by being shadowed by objects; and accordingly, the total amount of voltage generated by the other solar cells is reversely applied to the former solar cells (for example, Japanese Patent Application Publication No. 2013-33832).

SUMMARY OF THE INVENTION

One aspect of the invention provides a solar cell, which is capable of inhibiting the occurrence of the hot spot phenomenon.

A solar cell of an embodiment includes a semiconductor substrate of first conductivity type, including first and second principal surfaces; a region of the first conductivity type, including a semiconductor layer structure of the first conductivity type provided on the first principal surface; and a region of an second conductivity type, including a semiconductor layer structure of the second conductivity type provided on the first principal surface. Here, the semiconductor layer structure of the first conductivity type is formed extending into the region of the second conductivity type, and thereby the solar cell is provided with a stack region where the semiconductor layer structure of the second conductivity type is formed on the semiconductor layer structure of the first conductivity type.

The embodiments above are capable of inhibiting the occurrence of the hot spot phenomenon.

DESCRIPTION OF THE EMBODIMENTS

Figure 1:
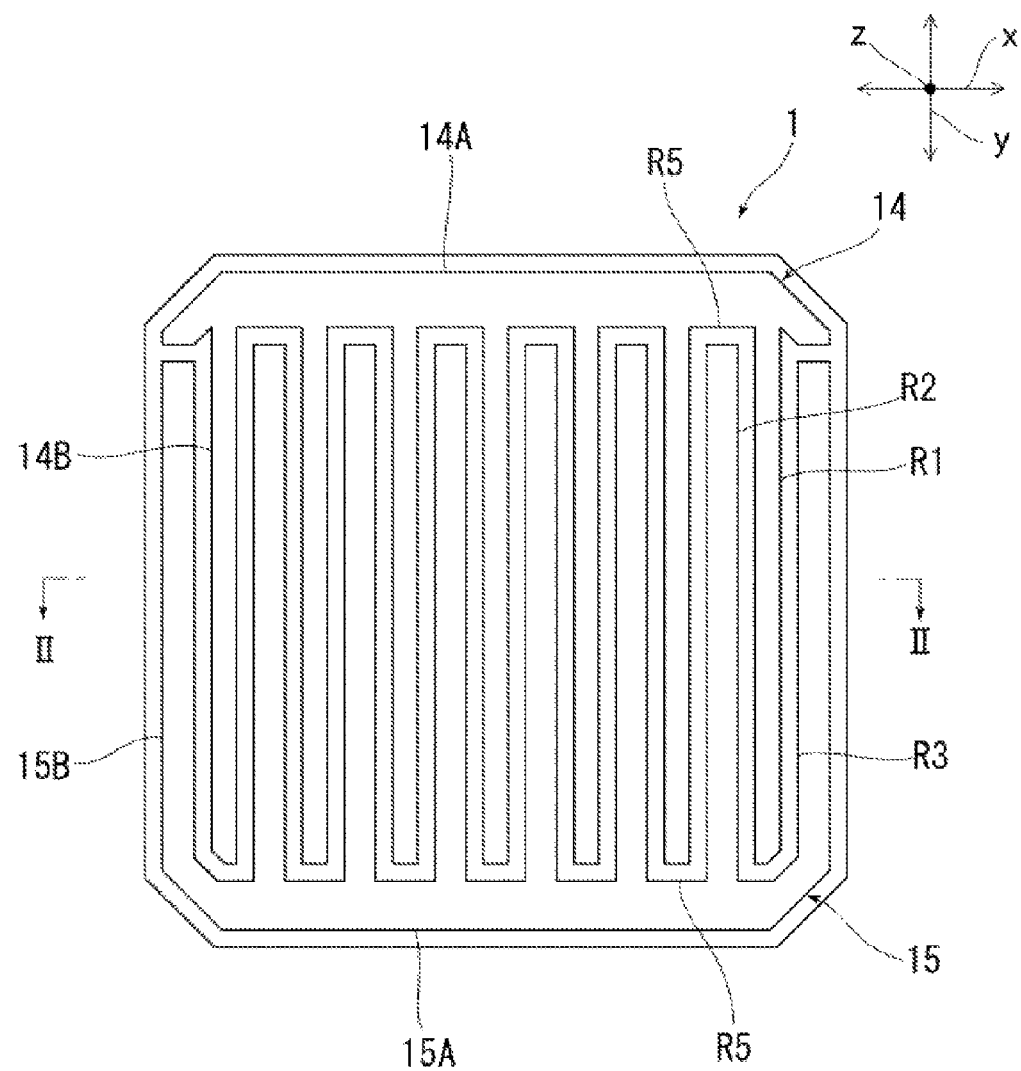
FIG. 1 is a schematic plan view of a solar cell of a first embodiment.

Embodiments are described below. It is to be noted, however, that the following embodiments are mere examples and the invention is not limited only to the embodiments. In the drawings, components having virtually the same functions may be referred to by using the same reference numerals when appropriate.

First Embodiment

Figure 2:
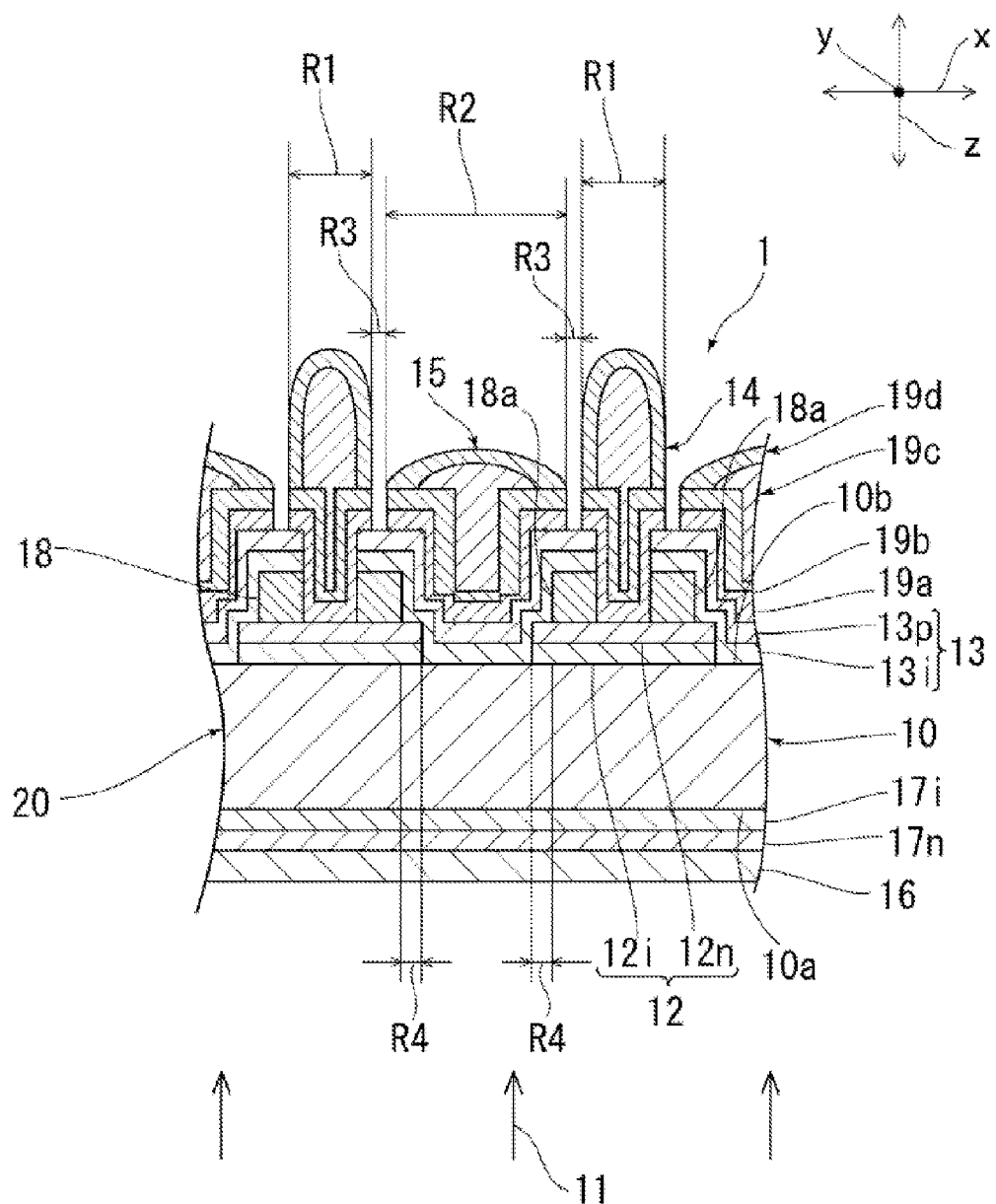
FIG. 2 is a schematic cross-sectional view illustrating a partially-magnified part of the solar cell taken along the II-II line of FIG. 1.

FIG. 1 is a schematic plan view of a solar cell of a first embodiment. FIG. 2 is a schematic cross-sectional view illustrating a partially-magnified cross section of the solar cell taken along the II-II line of FIG. 1.

Solar cell 1 is a back contact solar cell. FIG. 1 illustrates the rear surface of solar cell 1. As illustrated in FIG. 2, solar cell 1 includes semiconductor substrate 10. Semiconductor substrate 10 includes light-receiving surface 10a as a second principal surface, and rear surface 10b as a first principal surface. Semiconductor substrate 10 generates carriers when receiving light 11 by use of light-receiving surface 10a. Here, the carriers are holes and electrons, which are generated when the light is absorbed into semiconductor substrate 10.

Semiconductor substrate 10 is made of a crystalline semiconductor substrate whose conductivity type is n-type or p-type. Concrete examples of the crystalline semiconductor substrate include crystalline silicon substrates such as a monocrystalline silicon substrate and a polycrystalline silicon substrate. It should be noted that the semiconductor substrate may be made of a semiconductor substrate other than the crystalline semiconductor substrate. For example, a compound semiconductor substrate made of GaAs, InP or the like may be used in lieu of semiconductor substrate 10.

The embodiment is hereinbelow described by citing an example where semiconductor substrate 10 is made of a crystalline silicon substrate whose conductivity type is the n-type, one of the conductivity types.

Intrinsic amorphous semiconductor (intrinsic semiconductor is hereinafter referred to as "i-type semiconductor") is used to make i-type amorphous semiconductor layer 17i. I-type amorphous semiconductor layer 17i is formed on light-receiving surface 10a of semiconductor substrate 10. To put it concretely, in the embodiment, i-type amorphous semiconductor layer 17i is made of i-type amorphous silicon including hydrogen. No specific restriction is imposed on the thickness of i-type amorphous semiconductor layer 17i, as long as the thickness makes virtually no contribution to power generation. The thickness of i-type amorphous semiconductor layer 17i may be set in a range of several nanometers to about 25 nanometers, for example.

It should be noted that the "amorphous semiconductor" of the embodiment includes microcrystalline semiconductor. The microcrystalline semiconductor is semiconductor in which semiconductor crystals are deposited in the amorphous semiconductor.

N-type amorphous semiconductor layer 17n whose conductivity type is the same as that of semiconductor substrate 10 is formed on i-type amorphous semiconductor layer 17i. N-type amorphous semiconductor layer 17n is an amorphous semiconductor layer which is doped with an n-type dopant, and whose conductivity type is the n-type. To put it concretely, n-type amorphous semiconductor layer 17n is made of n-type amorphous silicon including hydrogen in the embodiment. No specific restriction is imposed on the thickness of n-type amorphous semiconductor layer 17n. The thickness of n-type amorphous semiconductor layer 17n may be set in a range of approximately 2 nanometers to 50 nanometers, for example.

Insulating layer 16, which exerts both a function as an antireflective film and a function as a protection film is formed on n-type amorphous semiconductor layer 17n. Insulating layer 16 may be made of silicon oxide, silicon nitride, or silicon oxynitride, for example. The thickness of insulating layer 16 may be set as needed depending on the antireflective characteristics given to the antireflective film. The thickness of insulating film 16 may be set in a range of approximately 80 nanometers to 1000 nanometers, for example.

The stacked structure including i-type amorphous semiconductor layer 17i, n-type amorphous semiconductor layer 17n and insulating layer 16 exerts a function as a passivation layer for semiconductor substrate 10 and a function as an antireflective film.

N-type semiconductor stacked structure 12 whose conductivity type is the n-type, the first conductivity type, and semiconductor stacked structure 13 whose conductivity is the p-type, the opposite conductivity type to the first conductivity type (second conductivity type), are formed on rear surface 10b of semiconductor substrate 10. N-type regions R1, regions having the first conductivity type, include n-type semiconductor stacked structure 12. P-type regions R2, regions having the second conductivity type, include p-type semiconductor stacked structure 13. As illustrated in FIG. 1, n-type regions R1 and p-type regions R2 are shaped like comb teeth and interdigitate each other. Thereby, n-type regions R1 and p-type regions R2 are alternated on rear surface 10b in a direction x perpendicular to an intersecting width direction y. Insulating region R3 is formed between n-type regions R1 and p-type regions R2. As illustrated in FIG. 1, insulating region R3 is formed in such a manner as to extend in the y direction, then to be folded back, and then to extend in the reverse y direction.

N-type semiconductor stacked structure 12 is formed from a stacked body including i-type amorphous semiconductor layer 12i as a first intrinsic semiconductor layer, formed on rear surface 10b; and n-type amorphous semiconductor layer 12n formed on i-type amorphous semiconductor layer 12i. Like i-type amorphous semiconductor layer 17i described above, i-type amorphous semiconductor layer 12i is made of amorphous silicon including hydrogen. No specific restriction is imposed on the thickness of i-type amorphous semiconductor layer 12i, as long as the thickness makes virtually no contribution to power generation. The thickness of i-type amorphous semiconductor layer 12i may be set in a range of several nanometers to about 25 nanometers, for example.

Like n-type amorphous semiconductor layer 17n, n-type amorphous semiconductor layer 12n is doped with an n-type dopant and has the conductivity type of the n-type like semiconductor substrate 10. To put it concretely, in the embodiment, n-type amorphous semiconductor layer 12n is made of n-type amorphous silicon including hydrogen. No specific restriction is imposed on the thickness of n-type amorphous semiconductor layer 12n. The thickness of n-type amorphous semiconductor layer 12n may be set in a range of approximately 2 nanometers to 50 nanometers, for example.

Insulating layer 18 is formed on the two end portions, excluding the center portion, of n-type semiconductor stacked structure 12 in the direction x. The center portion of n-type semiconductor stacked structure 12 in the direction x is exposed through insulating layer 18. No specific restriction is imposed on the material of insulating layer 18. Insulating layer 18 may be made of silicon oxide, silicon nitride, or silicon oxynitride, for example. It is desirable that insulating layer 18 be made of silicon nitride in particular. Furthermore, it is desirable that insulating layer 18 includes hydrogen.

P-type semiconductor stacked structure 13 is formed on portions of rear surface 10b, which are exposed through n-type semiconductor stacked structure 12, and end portions of insulating layer 18. P-type semiconductor stacked structure 13 is formed from a stacked body including i-type amorphous semiconductor layer, 13i as a second intrinsic semiconductor layer, formed on rear surface 10b; and p-type amorphous semiconductor layer 13p formed on i-type amorphous semiconductor layer 13i.

I-type amorphous semiconductor layer 13i is made of amorphous silicon including hydrogen. No specific restriction is imposed on the thickness of i-type amorphous semiconductor layer 13i, as long as the thickness makes virtually no contribution to power generation. The thickness of i-type amorphous semiconductor layer 13i may be set in a range of several nanometers to about 25 nanometers, for example.

P-type amorphous semiconductor layer 13p is an amorphous semiconductor layer which is doped with a p-type dopant, and whose conductivity type is the p-type. To put it concretely, in the embodiment, p-type amorphous semiconductor layer 13p is made of p-type amorphous silicon including hydrogen. No specific restriction is imposed on the thickness of p-type amorphous semiconductor layer 13p. The thickness of p-type amorphous semiconductor layer 13p may be set in a range of approximately 2 nanometers to 50 nanometers, for example.

In the embodiment, i-type amorphous semiconductor layer 13i with the thickness, which makes virtually no contribution to the power generation is provided between crystalline semiconductor substrate 10 and p-type amorphous semiconductor layer 13p. When like in the embodiment, i-type amorphous semiconductor layer 13i is provided between n-type semiconductor substrate 10 and p-type amorphous semiconductor layer 13p, it is possible to inhibit recombination of minority carriers in the junction interface between semiconductor substrate 10 and p-type semiconductor stacked structure 13. Consequently, the photoelectric conversion efficiency can be improved.

It is desirable that amorphous semiconductor layers 17i, 17n, 12i, 12n, 13i, 13p include hydrogen in order to enhance the passivation quality.

N-side electrode 14 as an electrode for the first conductivity type configured to collect electrons is formed on n-type amorphous semiconductor layer 12n. On the other hand, p-side electrode 15 as an electrode for the second conductivity type configured to collect holes is formed on p-type amorphous semiconductor layer 13p. P-side electrode 15 and n-side electrode 14 are electrically insulated from each other with insulating region R3 interposed in between.

As described above, n-type regions R1 and p-type regions R2 are shaped like comb teeth in the embodiment. Accordingly, as illustrated in FIG. 1, n-side electrode 14 includes bus bar 14A and a plurality of fingers 14B, while p-side electrode 15 includes bus bar 15A and a plurality of fingers 15B. Instead, however, each of n- and p-side electrodes 14, 15 may be a bus bar-less electrode including only a plurality of fingers with no bus bars.

No specific restriction is imposed on either n-side electrode 14 or p-side electrode 15, as long as the electrodes 14, 15 are capable of collecting carriers. In the embodiment, n- and p-side electrodes 14, 15 are each formed from a stacked body including first to fourth conductive layers 19a to 19d.

First conductive layer 19a may be made of, for example, a TCO (Transparent Conductive Oxide) such as ITO (indium tin oxide). To put it concretely, in the embodiment, first conductive layer 19a is made of ITO. The thickness of first conductive layer 19a may be set in a range of approximately 50 nanometers to 100 nanometers, for example. It should be noted that first conductive layer 19a may be formed by use of a thin-film forming method such as sputtering or CVD (Chemical Vapor Deposition).

Second to fourth conductive layers 19b to 19d may be made of a metal such as Cu, or its alloy. To put it concretely, in the embodiment, second and third conductive layers 19b, 19c are each made of Cu. Fourth conductive layer 19d is made of Sn. The thicknesses of second to fourth conductive layers 19b to 19d may be set, for example, in a range of approximately 50 nanometers to 1000 nanometers, in a range of approximately 10 micrometers to 20 micrometers, and in a range of approximately 1 micrometer to 5 micrometers, respectively.

In the embodiment, of first to fourth conductive layers 19a to 19d, second conductive layer 19b forms a seed layer. In this respect, the "seed layer" means a layer from which plating growth originates. In general, the seed layer is made of a metal or an alloy. As the seed layer, second conductive layer 19b may be formed by use of a thin-film forming method other than plating, such as sputtering, vapor deposition, printing or ink-jetting.

In the embodiment, third and fourth conductive layers 19c, 19d are each formed by electroplating.

(Stack Region R4)

As illustrated in FIG. 2, n-type semiconductor stacked structures 12 are each formed extending to p-type regions R2. To put it concretely, n-type semiconductor stacked structure 12 is formed projecting beyond p-type region R2-side end portion 18a of insulating layer 18 further into p-type region R2. For this reason, stack region R4 in which p-type semiconductor stacked structure 13 is formed directly on n-type semiconductor stacked structure 12 is formed in each of the two end portions of p-type region R2. In the stack region R4, n-type semiconductor stacked structure 12 and p-type semiconductor stacked structure 13 are stacked on n-type semiconductor substrate 10 in this sequence. Accordingly, the p/i/n/i/n semiconductor stacked structure is formed in stack region R4.

The p/i/n/i/n semiconductor stacked structure has nonlinear IV characteristics. When a reverse bias voltage of several volts is applied to it, the p/i/n/i/n semiconductor stacked structure yields, and turns into a current leak path. Accordingly, when a reverse bias voltage to trigger the hot spot phenomenon is applied to solar cell 1, the p/i/n/i/n semiconductor stacked structure serves as a current leak path, and is capable of inhibiting the occurrence of the hot spot phenomenon.

In the embodiment, the p/i/n/i/n semiconductor stacked structure is presented as the semiconductor stacked structure to be formed in stack region R4. However, the semiconductor stacked structure to be formed in stack region R4 is not limited to this. Instead, an n/i/p/i/p semiconductor stacked structure, for example, may be formed in stack region R4 by stacking a p-type semiconductor stacked structure and an n-type semiconductor stacked structure on a p-type semiconductor substrate in this sequence. The n/i/p/i/p semiconductor stacked structure has nonlinear IV characteristics, too. For this reason, when a reverse bias voltage of several volts is applied to it, the n/i/p/i/p semiconductor stacked structure yields, and turns into a current leak path. Accordingly, when a reverse bias voltage to trigger the hot spot phenomenon is applied to the solar cell, the n/i/p/i/p semiconductor stacked structure serves as a current leak path, and is capable of inhibiting the occurrence of the hot spot phenomenon.

In the embodiment, presented as the example of the semiconductor stacked structure having the first conductivity type is the semiconductor stacked structure having the first conductivity type (n-type semiconductor stacked structure 12) including the first intrinsic semiconductor layer (i-type amorphous semiconductor layer 12i) provided on first principal surface 10b, and the semiconductor layer having the first conductivity type (n-type amorphous semiconductor layer 12n) provided on the first intrinsic semiconductor layer (i-type amorphous semiconductor layer 12i). Furthermore, presented as the example of the semiconductor stacked structure having the second conductivity type is the semiconductor stacked structure having the second conductivity type (p-type semiconductor stacked structure 13) including the second intrinsic semiconductor layer (i-type amorphous semiconductor layer 13i) provided on first principal surface 10b, and the semiconductor layer having the second conductivity type (p-type amorphous semiconductor layer 13p) provided on the second intrinsic semiconductor layer (i-type amorphous semiconductor layer 13i).

However, neither the "semiconductor stacked structure having the first conductivity type" nor the "semiconductor stacked structure having the second conductivity type" in the invention is limited to the above examples. For example, the semiconductor stacked structure having the first conductivity type may be formed from only a semiconductor layer having the first conductivity type, while the semiconductor stacked structure having the second conductivity type may be formed from only a semiconductor layer having the second conductivity type. Accordingly, neither the first intrinsic semiconductor layer nor the second intrinsic semiconductor layer has to be provided to the semiconductor stacked structure having the first conductivity type or the semiconductor stacked structure having the second conductivity type. In this case, therefore, the stack region may have either a p/n/n semiconductor stacked structure or an n/p/p semiconductor stacked structure.

Figure 3:
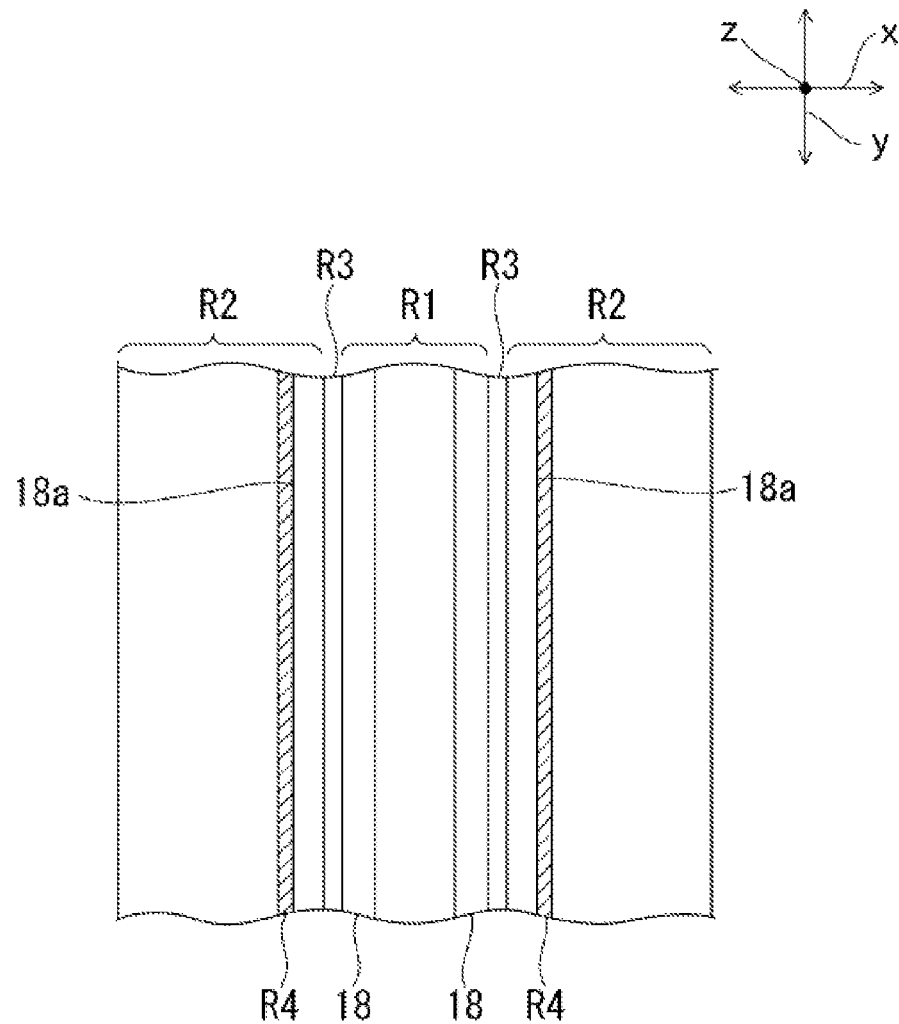
FIG. 3 is a schematic plan view illustrating stack regions in the first embodiment.

FIG. 3 is a schematic plan view of stack regions in the first embodiment. As illustrated in FIG. 3, in the embodiment, n-type region R1, the region having the first conductivity type, and p-type regions R2, the regions having the second conductivity type, are formed extending in a first direction (the y direction). In addition, insulating layer 18 and insulating region R3 are formed extending in the first direction (the y direction), too. As illustrated in FIG. 1, in turn region R5, insulating region R3 is formed extending once in the x direction and then extending in the reverse y direction. Accordingly, in turn region R5, stack region R4 is formed in a way to extend in the direction (the x direction) intersecting the first direction (the y direction).

In a plan view, as illustrated in FIG. 3, each stack region R4 is formed outside end portion 18a of insulating layer 18 (inside p-type region R2). It is desirable that the width of stack region R4 in a direction (for example, the x direction in FIG. 3) perpendicular to the longitudinal direction (for example, the y direction in FIG. 3) be set in a range of 1 micrometer to 100 micrometers. More desirably, the width thereof is set in a range of 3 micrometers to 30 micrometers.
(Method of Manufacturing Solar Cell)

Referring to FIGS. 4 to 11, descriptions are hereinbelow provided for a method of manufacturing solar cell 1 of the embodiment.

Figure 4:
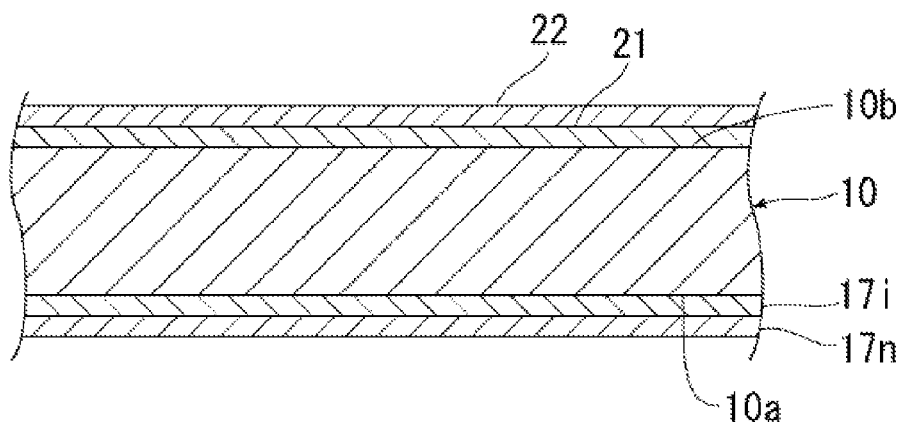
FIG. 4 is a schematic cross-sectional view for explaining manufacturing steps for the solar cell of the first embodiment.

To begin with, semiconductor substrate 10 is prepared. Thereafter, as illustrated in FIG. 4, i-type amorphous semiconductor layer 17$i$ and n-type amorphous semiconductor layer 17$n$ are formed on light-receiving surface 10$a$ of semiconductor substrate 10, as well as i-type amorphous semiconductor layer 21 and n-type amorphous semiconductor layer 22 are formed on rear surface 10$b$. No specific restriction is imposed on how to form i-type amorphous semiconductor layers 17$i$, 21 and n-type amorphous semiconductor layers 17$n$, 22. i-type amorphous semiconductor layers 17$i$, 21 and n-type amorphous semiconductor layers 17$n$, 22 may be each formed by, for example, CVD (Chemical Vapor Deposition) such as plasma CVD.

Figure 5:
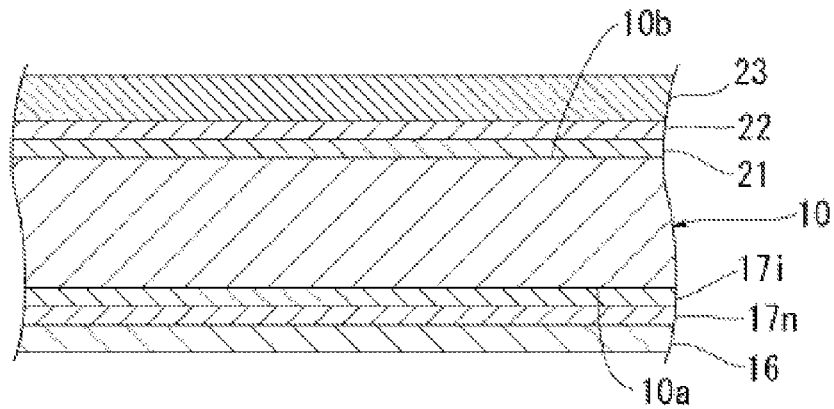
FIG. 5 is another schematic cross-sectional view for explaining the manufacturing steps for the solar cell of the first embodiment.

Subsequently, as illustrated in FIG. 5, insulating layer 16 is formed on n-type amorphous semiconductor layer 17$n$, and insulating layer 23 is formed on n-type amorphous semiconductor layer 22. Here, no specific restriction is imposed on how to form insulating layers 16, 23. Insulating layers 16, 23 may be formed by, for example, a thin-film forming method such as sputtering or CVD.

Figure 6:
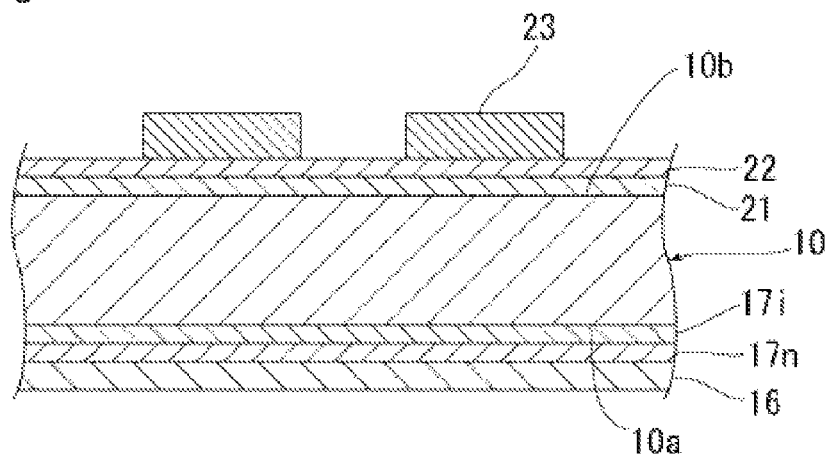
FIG. 6 is another schematic cross-sectional view for explaining the manufacturing steps for the solar cell of the first embodiment.

Next, as illustrated in FIG. 6, a part of insulating layer is removed by etching insulating layer 23. To put it concretely, a part located on a region through which the p-type semiconductor layer is joined to semiconductor substrate 10 in a subsequent step is removed from insulating layer 23. Here, insulating layer 23 may be etched with, for example, an acidic etchant such as a HF aqueous solution when insulating layer 23 is made of silicon oxide, silicon nitride or silicon oxynitride.

Figure 7:
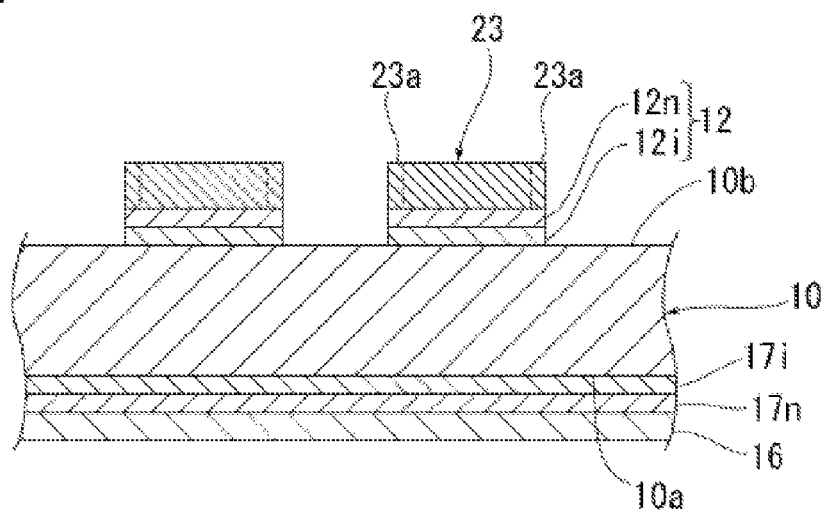
FIG. 7 is another schematic cross-sectional view for explaining the manufacturing steps for the solar cell of the first embodiment.

Thereafter, as illustrated in FIG. 7, by using patterned insulating layer 23 as a mask, i-type amorphous semiconductor layer 21 and n-type amorphous semiconductor layer 22 are etched with an alkaline etchant. Thereby, parts of i-type amorphous semiconductor layer 21 and n-type amorphous semiconductor layer 22, except for their parts covered with insulating layer 23, are removed. By this, part of rear surface 10$b$, above which no insulating layer 23 is located, is exposed. In addition, i-type amorphous semiconductor layer 12$i$ and n-type amorphous semiconductor layer 12$n$ (see FIG. 2) are formed from semiconductor layers 21, 22, respectively.

Here, in the embodiment, as described above, insulating layer 23 is made of silicon oxide, silicon nitride or silicon oxynitride. For this reason, the etching rate at which insulating layer 23 is etched with the acidic etchant is high whereas the etching rate at which insulting layer 23 is etched with the alkaline etchant is low. On the other hand, semiconductor layers 21, 22 are made of the amorphous silicon. For this reason, the etching rate at which semiconductor layers 21, 22 are etched with the acidic etchant is low whereas the etching rate at which semiconductor layers 21, 22 are etched with the alkaline etchant is high. Accordingly, insulating layer 23 is etched with the acidic etchant which is used in the step illustrated in FIG. 6, while semiconductor layers 21, 22 are virtually not etched with the acidic etchant. On the other hand, semiconductor layers 21, 22 are etched with the alkaline etchant which is used in the step illustrated in FIG. 7, while insulating layer 23 is virtually not etched with the alkaline etchant. For these reasons, insulating layer 23 and semiconductor layers 21, 22 can be selectively etched in the step illustrated in FIG. 6 and in the step illustrated in FIG. 7, respectively.

Figure 8:
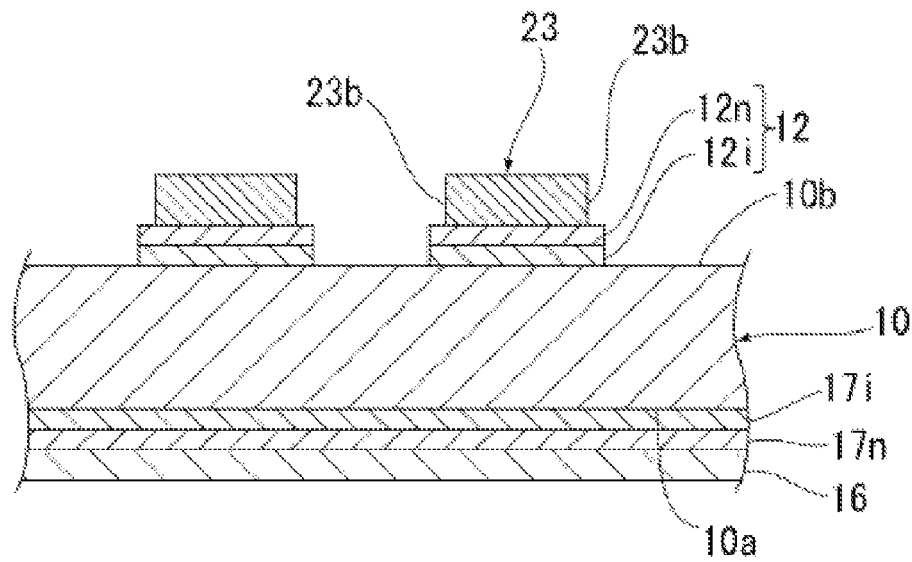
FIG. 8 is another schematic cross-sectional view for explaining the manufacturing steps for the solar cell of the first embodiment.

Subsequently, parts corresponding to peripheral portions 23$a$ of insulating layer 23, which are illustrated in FIG. 7, are etched and removed with the same acidic etchant as is used in the step illustrated in FIG. 6. Thereby, as illustrated in FIG. 8, end portions 23$b$ of insulting layer 23 retreat, and n-type semiconductor stacked structure 12 is exposed outside end portions 23$b$. It should be noted that in the steps illustrated in FIGS. 7 and 8, parts corresponding to peripheral portions 23$a$ of insulating layer 23 may be etched by photolithography or the like.

Figure 9:
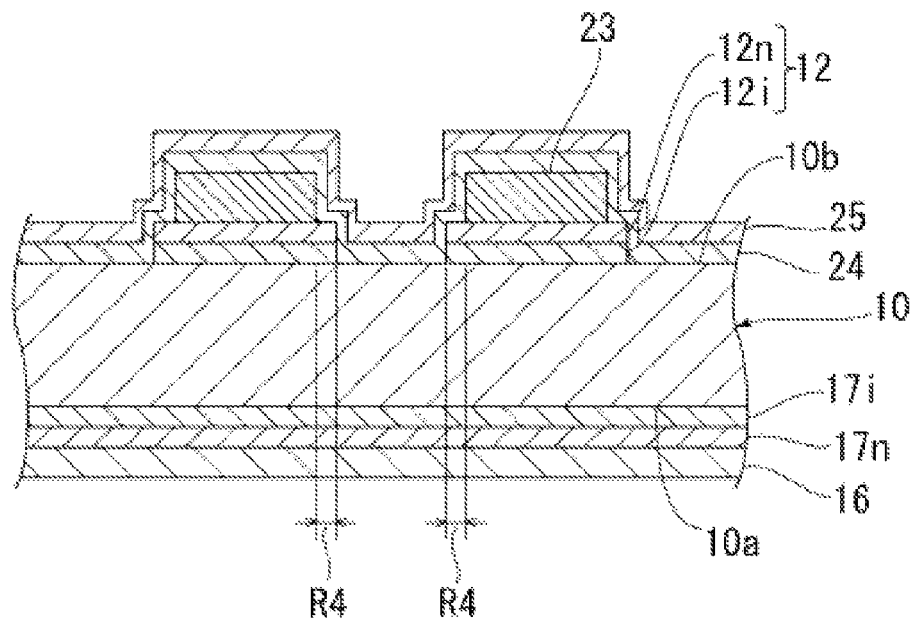
FIG. 9 is another schematic cross-sectional view for explaining the manufacturing steps for the solar cell of the first embodiment.

Thereafter, as illustrated in FIG. 9, i-type amorphous semiconductor layer 24 and p-type amorphous semiconductor layer 25 are formed in a way to cover rear surface 10$b$ in this sequence. No specific restriction is imposed on how to form amorphous semiconductor layers 24, 25. Semiconductor layers 24, 25 may be formed by, for example, CVD or the like.

Figure 10:
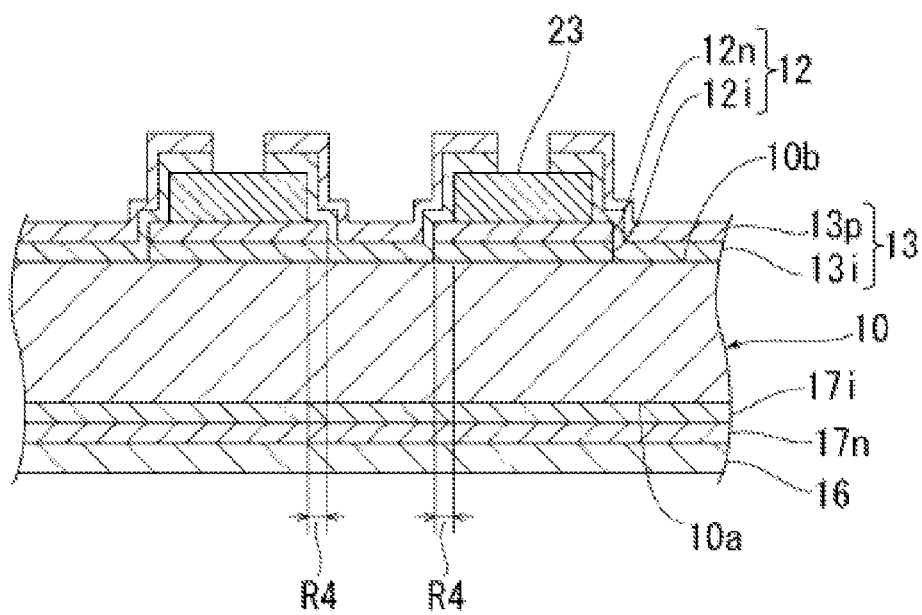
FIG. 10 is another schematic cross-sectional view for explaining the manufacturing steps for the solar cell of the first embodiment.

Next, as illustrated in FIG. 10, parts of portions of amorphous semiconductor layers 24, 25 located on insulating layer 23 are etched. Thereby, i-type amorphous semiconductor layer 13$i$ and p-type amorphous semiconductor layer 13$p$ are formed from amorphous semiconductor layers 24, 25. Used in this step is a first etchant, which makes the etching rate on amorphous semiconductor layers 24, 25 larger than the etching rate on insulating layer 23. For this reason, among insulating layer and amorphous semiconductor layers 24, 25, amorphous semiconductor layers 24, 25 are selectively etched.

It should be noted that the "etchant" includes paste-like etching paste, and etching ink whose viscosity is adjusted.

Figure 11:
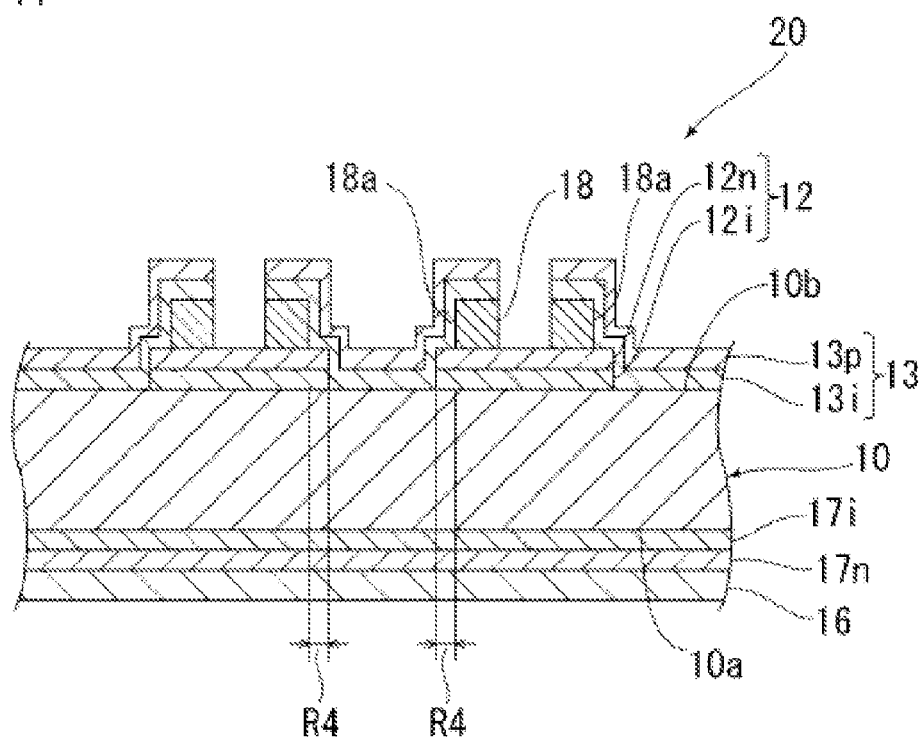
FIG. 11 is another schematic cross-sectional view for explaining the manufacturing steps for the solar cell of the first embodiment.

Subsequently, as illustrated in FIG. 11, insulating layer is etched. To put it concretely, by using amorphous semiconductor layers 13$i$, 13$p$ as a mask, an exposed portion of insulating layer 23 is etched and removed with a second etchant. Thereby, n-type amorphous semiconductor layer 12$n$ is exposed, and insulating layer 18 is formed from insulating layer 23. End portions 23$b$ of insulating layer 23, which are illustrated in FIG. 8, correspond to end portions 18$a$ of insulating layer 18, which are illustrated in FIG. 11.

Used in this step is the second etchant, which makes the etching rate on insulating layer 23 larger than the etching rate on amorphous semiconductor layers 24, 25. For this reason, among insulating layer 23 and amorphous semiconductor layers 24, 25, insulating layer 23 is selectively etched.

As described above, n-type semiconductor stacked structure 12 including i-type amorphous semiconductor layer 12i and n-type amorphous semiconductor layer 12n, as well as p-type semiconductor stacked structure 13 including i-type amorphous semiconductor layer 13i and p-type amorphous semiconductor layer 13p, can be formed on first principal surface 10b of semiconductor substrate 10.

Thereafter, an electrode forming step of forming n-side electrode 14 and p-side electrode 15 respectively on n-type amorphous semiconductor layer 12n and p-type amorphous semiconductor layer 13p is carried out by use of the same method as is described in Japanese Patent Application Publication No. 2012-33666. Thereby, solar cell 1 illustrated in FIG. 2 can be finished.

To put it concretely, first conductive layer 19a made of the TCO and second conductive layer 19b made of the metal such as Cu or its alloy are formed in this sequence by use of the thin-film forming method including CVD (Chemical Vapor Deposition) such as plasma CVD, and sputtering. Thereafter, portions located on insulating layer 18 are separated. Thereby, first and second conductive layers 19a, 19b are formed in the state illustrated in FIG. 2. It should be noted that this separation can be achieved by, for example, photolithography or the like.

Subsequently, third conductive layer 19c made of Cu and fourth conductive layer 19d made of Snare formed in this sequence on first and second conductive layers 19a, 19b by electrolytic plating. Thereby, n-side electrode 14 and p-side electrode 15, which are illustrated in FIG. 2, can be finished.

With the foregoing steps, solar cell 1 illustrated in FIG. 2 can be manufactured.

Second Embodiment

Figure 12:
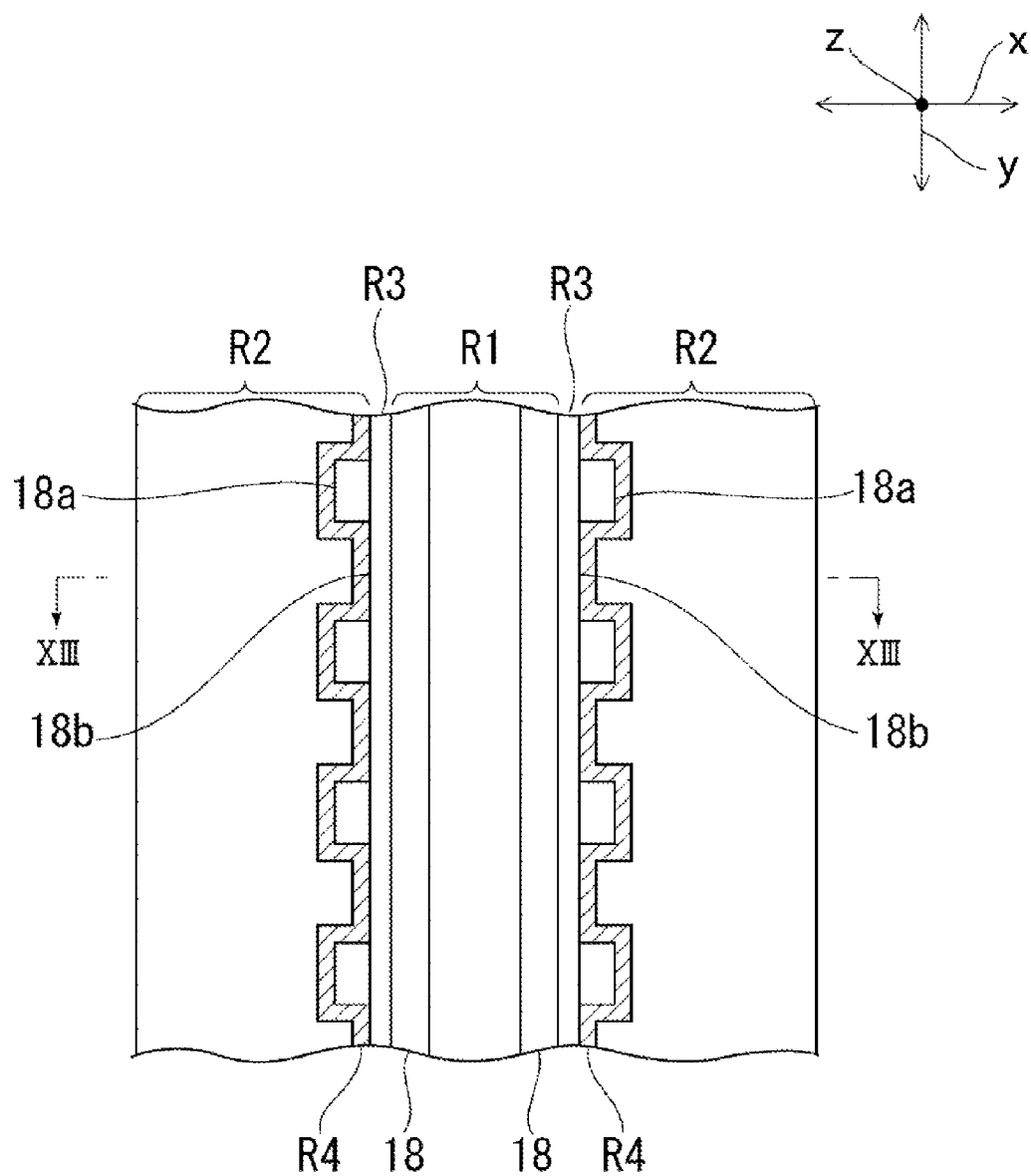
FIG. 12 is a schematic plan view illustrating stack regions in a second embodiment.
Figure 13:
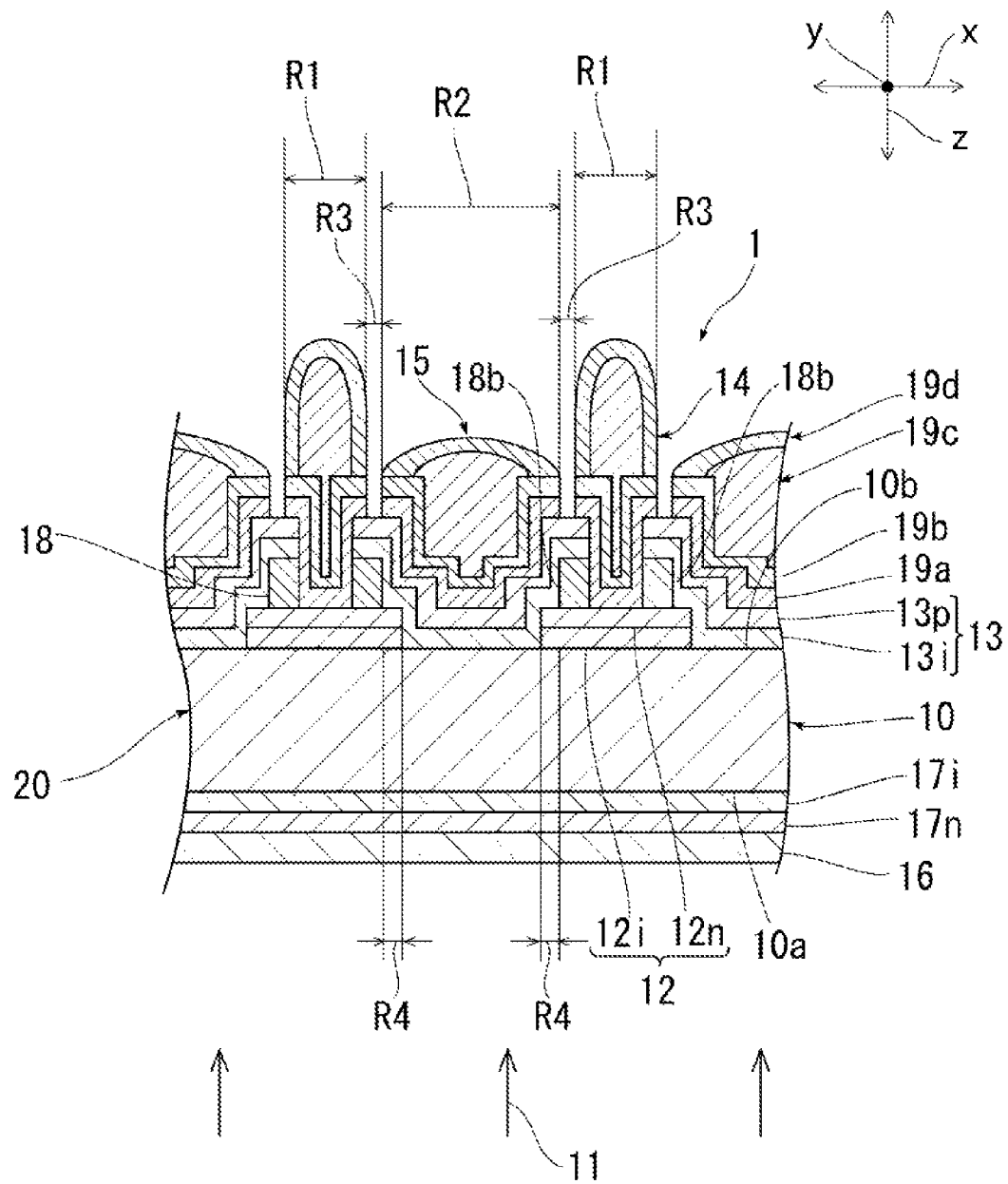
FIG. 13 is a schematic cross-sectional view illustrating a cross section of n-type regions R1 and p-type region R2 taken along the XIII-XIII line of FIG. 12.

FIG. 12 is a schematic plan view illustrating stack regions R4 in a second embodiment. FIG. 13 is a schematic cross-sectional view illustrating the cross section of n-type regions R1 and p-type region R2 taken along the XIII-XIII line of FIG. 12.

In the embodiment, as illustrated in FIG. 12, in a plan view, projecting portions including end portions 18a, and recessed portions including end portions 18b are formed in insulating layer 18. A cross section including the recessed portions corresponds to the cross section illustrated in FIG. 13, and a cross section including the projecting portions corresponds to the cross section illustrated in FIG. 2. Since in the plan view, the recessed portions and the projecting portions are formed in insulating layer 18, parts of stack regions R4 are formed extending in a second direction (the x direction) intersecting the first direction (the y direction).

To put it concretely, in the embodiment, the recessed portions set back toward n-type region R1, the region having the first conductivity type, are formed in stack regions R4. Thereby, areas extending in the first direction (the x direction) and areas extending in the second direction (the y direction) are formed in stack region R4. For this reason, the embodiment can increase stack regions R4, compared with the first embodiment illustrated in FIG. 3. The increase in stack regions R4 makes it possible to increase the current leak path when a reverse bias voltage is applied to the solar cell, and to inhibit the occurrence of the hot spot reliably.

Insulating layer 18 of the embodiment can be formed by patterning insulating layer 23 in a way that in the plan view, recessed portions and projecting portions, as illustrated in FIG. 12, are formed in a step of etching insulating layer 23 illustrated in FIG. 6. Thereafter, parts corresponding to peripheral portions 23a (see FIG. 7) of insulating layer 23 which include the thus formed recessed and projecting portions are etched and removed. Thereby, stack regions R4 can be formed in the outer (p-type region R2-side) vicinity of end portions 18a and end portions 18b of insulting layer 18.

Third Embodiment

Figure 14:
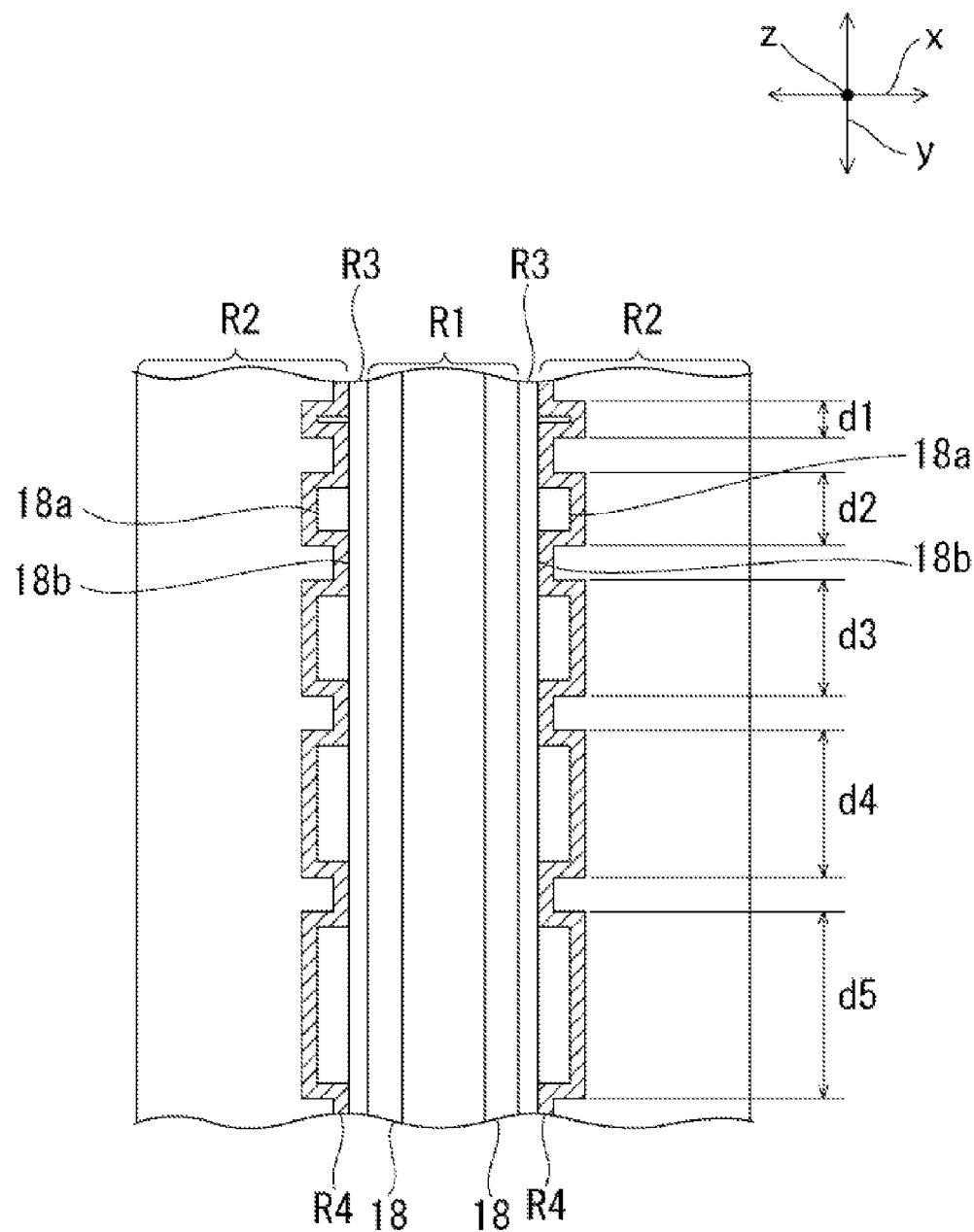
FIG. 14 is a schematic plan view illustrating a stack region in a third embodiment.

FIG. 14 is a schematic plan view illustrating stack regions R4 in a third embodiment. In the embodiment, as illustrated in FIG. 14, in a plan view, projecting portions including end portions 18a, and recessed portions including end portions 18b are formed in insulating layer 18. In the embodiment, the recessed portions are formed in a way that the recessed portions are arranged in the first direction (the y direction); and distances d1 to d5 between the recessed portions adjacent in the first direction (the y direction), i.e. the y-direction widths of the projecting portions including stack regions R4, are different from one another. The distances between the recessed portions include three or more distances d1 to d5, which are different from one another.

As described above, the recessed and projecting portions of insulating layer 18 are formed by patterning. For this reason, if the distances between the recessed portions are too narrow, it is likely in some cases that the forms of the recessed and projecting portions cannot be clearly formed depending on changes in etching conditions and the like. In this respect, the changes in the etching conditions and the like include a change in the state of a foundation layer, a change in the concentration of the etchant, and a change in the etching temperature.

When like in the embodiment, the recessed portions are formed in a way that the distances between the recessed portions are different from one another, the forming of the recessed and projecting portions in insulating layer 18 can be achieved at least in an area in which the distances between the recessed portions are wider. For this reason, even if the etching conditions and the like change, the forming of the recessed and projecting portions in insulating layer 18 can be achieved between some of the recessed portions, and stack regions R4 can be increased. In sum, the embodiment can surely increase stack regions R4 even if the etching conditions and the like change, and thus can surely increase the current leak path when a reverse bias voltage is applied to the solar cell. Accordingly, the embodiment is capable of inhibiting the occurrence of the hot spot more reliably.

In the embodiment, stack regions R4 in which the recessed and projected portions are formed are presented as an example that can increase stack regions R4. The invention, however, is not limited to this. For example, stack regions R4 may be formed in a zigzag or wavy shape in a plan view. Stack regions R4 can be increased when stack regions R4 are formed in the zigzag or wavy shape than when stack regions R4 are formed in the linear shape.

Fourth Embodiment

Figure 15:
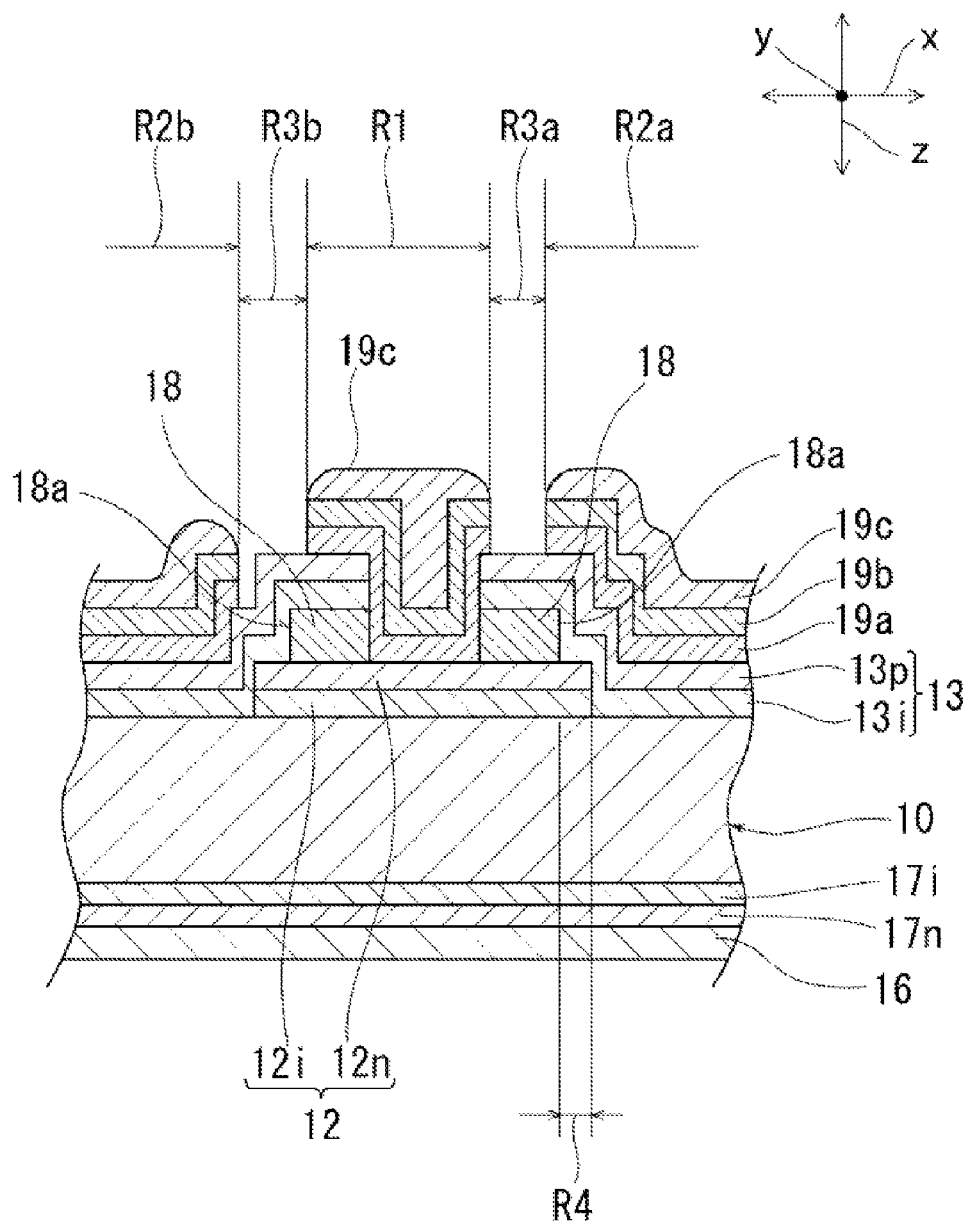
FIG. 15 is a schematic cross-sectional view illustrating a cross section of n-type region R1 and p-type regions R2a, R2b in a fourth embodiment.

FIG. 15 is a schematic cross-sectional view illustrating a cross section of n-type region R1 and p-type regions R2a, R2b in a fourth embodiment.

As illustrated in FIG. 15, in the embodiment, n-type semiconductor stacked structure 12 is formed projecting from p-type region R2a-side end portion 18a of insulating layer 18 further into p-type region R2a. As a result, stack region R4 where p-type semiconductor stacked structure 13 is formed on n-type semiconductor stacked structure 12 is formed in p-type region R2a.

Meanwhile, n-type semiconductor stacked structure 12 is formed projecting beyond p-type region R2b-side end portion 18a of insulating layer 18 further to p-type region R2b, too. Insulating region R3b on the side of p-type region R2b is formed closer to p-type region R2b than insulating region R3a on the side of p-type region R2a is. For these reasons, part of n-type semiconductor stacked structure 12 formed projecting beyond end portion 18a of insulating layer 18 exists inside insulating region R3b. Accordingly, in insulating regions R3b, p-type semiconductor stacked structure 13 is stacked on n-type semiconductor stacked structure 12. No stack region R4 of the embodiment is formed in insulating region R3b.

In sum, in the embodiment, stack region R4 is formed in p-type region R2a only, but no stack region R4 is formed in p-type region R2b.

In the embodiment, stack region R4 only needs to be formed in any one of p-type regions R2a, R2b on the two sides across n-type region R1. Accordingly, positional accuracy to form insulating regions R1a, R3b may be lower in the embodiment than in the first embodiment illustrated in FIGS. 2 and 3. For this reason, the degree of integration can be increased by arranging n-type region R1 and p-type regions R2a, R2b in a narrower pitch. In other words, it is possible to achieve more reliable inhibition of occurrence of a hot spot in the solar cell and the increase in power generation efficiency at the same time.

The foregoing embodiments are based on the case where the first conductivity type is the n-type and the second conductivity type is the p-type. However, the invention is not limited this. The first conductivity type may be the p-type and the second conductivity type may be the n-type.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell comprising:
a semiconductor substrate of a first conductivity type, including first and second principal surfaces;
a region of the first conductivity type, including a semiconductor layer structure of the first conductivity type provided on the first principal surface;
a region of a second conductivity type, including a semiconductor layer structure of the second conductivity type provided on the first principal surface;
a first electrode on the semiconductor layer structure of the first conductivity type; and
a second electrode on the semiconductor layer structure of the second conductivity type, wherein
the semiconductor layer structure of the first conductivity type extends, in a first direction from the region of the first conductivity type to the region of the second conductivity type, into the region of the second conductivity type so as to have a stack region where the semiconductor layer structure of the second conductivity type is stacked on the semiconductor layer structure of the first conductivity type in a direction orthogonal to the first principal surface,
the stack region comprises:
a first stack region where an insulation layer is between the semiconductor layer structures of the first and second conductivity types in the direction orthogonal to the first principal surface; and
a second stack region where the semiconductor layer structure of the second conductivity type is stacked directly on the semiconductor layer structure of the first conductivity type in the direction orthogonal to the first principal surface,
the second electrode covers, as seen in the direction orthogonal to the first principal surface, the semiconductor layer structure of the second conductivity type in the second stack region,
the insulation layer between the semiconductor layer structures of the first and second conductivity types comprises a side surface in the region of the second conductivity type, the side surface extending along the direction orthogonal to the first principal surface,
the semiconductor layer structure of the first conductivity type comprises an extending part that extends, with respect to the side surface of the insulation layer, in the first direction from the region of the first conductivity type to the region of the second conductivity type,
a first surface of the extending part of the semiconductor layer structure of the first conductivity type is in direct contact with one main surface of the semiconductor layer structure of the second conductivity type in the second stack region, the first surface of the extending part and the one main surface of the semiconductor layer structure of the second conductivity type being parallel to the first principal surface, the first surface of the extending part and the one main surface of the semiconductor layer structure of the second conductivity type facing each other,
the insulation layer between the semiconductor layer structures of the first and second conductivity types comprises two surfaces parallel to the first principal surface,
one of the two surfaces closer to the first principal surface is entirely in direct contact with the semiconductor layer structure of the first conductivity type, and
the other of the two surfaces is entirely in direct contact with the semiconductor layer structure of the second conductivity type.

2. The solar cell according to claim 1, wherein
the semiconductor layer structure of the first conductivity type is a semiconductor stacked structure of the first conductivity type including a first intrinsic semiconductor layer provided on the first principal surface and a semiconductor layer of the first conductivity type provided on the first intrinsic semiconductor layer, and
the semiconductor layer structure of the second conductivity type is a semiconductor stacked structure of the second conductivity type including a second intrinsic semiconductor layer provided on the first principal surface, and a semiconductor layer of the second conductivity type provided directly on the second intrinsic semiconductor layer.

3. The solar cell according to claim 1, wherein
a part of the stack region extends in a second direction intersecting the first direction, the second direction being parallel to the first principal surface.

4. The solar cell according to claim 3, wherein
the insulation layer comprises a recessed portion set back into the region of the first conductivity type in the second stack region, and
thereby, the second stack region comprises an area extending in the first direction and an area extending in the second direction.

5. The solar cell according to claim 4, wherein
recessed portions are arranged along the first direction, and
distances between the recessed portions adjacent in the first direction are different from one another.

6. The solar cell according to claim 5, wherein
the distances between the recessed portions include three or more distances, which are different from one another.

7. The solar cell according to claim 1, wherein
the stack region is in any one of the regions of the second conductivity type on two sides across the region of the first conductivity type.

8. The solar cell according to claim 2, wherein
the stack region is in any one of the regions of the second conductivity type on two sides across the region of the first conductivity type.

9. The solar cell according to claim 1, wherein
the first conductivity type is n-type, and
the second conductivity type is p-type.

10. The solar cell according to claim 1, wherein
the insulation layer between the semiconductor layer structures of the first and second conductivity types has a projecting-recessed shape as seen in the direction orthogonal to the first principal surface, and
a projecting portion of the projecting-recessed shape of the insulation layer is in the first stack region.

11. The solar cell according to claim 1, wherein
the insulation layer between the semiconductor layer structures of the first and second conductivity types has a projecting-recessed shape as seen in the direction orthogonal to the first principal surface, and
a recessed portion of the projecting-recessed shape of the insulation layer is in the second stack region.

12. The solar cell according to claim 1, wherein
in a direction in which the first electrode extends on the first principal surface, the first stack regions and the second stack regions are arranged alternately.

13. The solar cell according to claim 1, wherein
an insulating region is provided between the region of the first conductivity type and the region of the second conductivity type in the first direction on the first principal surface, both the first electrode and the second electrode not being provided in the insulating region, and
the semiconductor layer structure of the first conductivity type extends in the first direction across the insulating region into the region of the second conductivity type.

* * * * *